United States Patent
Huang et al.

(10) Patent No.: US 6,365,503 B1
(45) Date of Patent: Apr. 2, 2002

(54) METHOD OF IMPROVING ELECTROMIGRATION IN SEMICONDUCTOR DEVICE MANUFACTURING PROCESSES

(75) Inventors: Jia Sheng Huang; Seung H. Kang; Anthony S. Oates; Yaw S. Obeng, all of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/594,189

(22) Filed: Jun. 14, 2000

Related U.S. Application Data

(60) Provisional application No. 60/141,656, filed on Jun. 30, 1999.

(51) Int. Cl.[7] .......................................... H01L 21/4763
(52) U.S. Cl. ....................................... 438/623; 438/745
(58) Field of Search ................................ 438/623, 627, 438/629, 648, 672, 687, 927, 745, 754

(56) References Cited

U.S. PATENT DOCUMENTS 6,133,158 A  * 10/2000  Obeng et al. ............... 438/745

OTHER PUBLICATIONS

Yaw S. Obeng, R.S. Raghavan; "'Back End' Chemical Cleaning in Integrated Circuit Fabrication: A Tutorial"; Material Research Society Symposium Proc., vol. 477, 1997; pp. 145–157.

* cited by examiner

*Primary Examiner*—David Nelms
*Assistant Examiner*—Dung A. Le

(57) ABSTRACT

The present invention provides a method of forming an electromigration resisting layer in a semiconductor device. In an exemplary embodiment, the method comprises depositing a corrosion inhibitor comprising an organic ligand on a conductive layer of a semiconductor device wherein the conductive layer is susceptible to electromigration. The method further includes subjecting the corrosion inhibitor and the semiconductor device to a high temperature anneal to form an electromigration resisting layer on the conductive layer that reduces electromigration of the conductive layer.

24 Claims, 5 Drawing Sheets

METHOD OF IMPROVING ELECTROMIGRATION IN SEMICONDUCTOR DEVICE MANUFACTURING PROCESSES

CROSS-REFERENCE TO PROVISIONAL APPLICATION

This application claims the benefit of U.S. Provisional Application No. 60/141,656 entitled "A METHOD OF IMPROVING ELECTROMIGRATION IN SEMICONDUCTOR DEVICE MANUFACTURING PROCESS," to Jia Sheng Huang, et. al., filed on Jun. 30, 1999, which is commonly assigned with the present invention and incorporated herein by reference as if reproduced herein in its entirety.

TECHNICAL FIELD OF THE INVENTION

The present invention is directed, in general, to a method of manufacturing a semiconductor device and, more specifically, to a method of reducing electromigration in a semiconductor device during the manufacturing of the device.

BACKGROUND OF THE INVENTION

The ever increasing use of integrated circuits (ICs) within computer and telecommunications technologies and the desire to continually increase the speed and the packing densities of such ICs has prompted the semiconductor manufacturing industry to decrease the size of many of the components that comprise the conventional IC. Along with other components of the IC, the interconnect has continually decreased in size. Specifically, the width of the interconnects have substantially decreased, while the interconnect's length has only reduced slightly. What has resulted is a relatively long but narrow interconnect trace.

Unfortunately, however, a problem exists with respect to these narrow interconnects. The problem results from higher amounts of electromigration (EM) which becomes pronounced at high electrical current densities. Electrons having a presumably large amount of momentum, carry the atoms of the interconnect material from the negative end of the interconnect to the positive end, and as a result compressive stresses build up at the positive end and tensile stresses build up at the negative end, creating what is collectively called backstress. When the backstress is equal to the EM, no plastic deformation occurs. However, plastic deformation arises when the EM is greater than the backstress, which in turn may create voids in the metal. These voids increase the resistance of the device and may also cause IC failure. Thus, it is highly desirable to decrease the amount of electromigration that occurs in ICs.

The semiconductor manufacturing industry has attempted to address this EM problem in various ways. For example, one solution is to place barrier layers on top of and below the interconnect. With the use of the barrier layers, the IC manufacturing industry is able to provide an interconnect that is less prone to EM open failure as well as an interconnect capable of surviving higher current densities. Unfortunately, however, the barrier layers are not without problems. It has been found that these barrier layers will shunt a significant amount of current after the aluminum is removed. High Joule heating, caused by the current, can cause the layers to heat up and crack, thus causing the interconnect structure, and ultimately the semiconductor device, to fail.

Integrated circuits contain millions of tungsten plug vias to connect interlevel metal runners. The vias however are potential failure sites because the vias are favorable sites for electromigration failure due to atomic flux divergences. Unlike metal runners terminated by pads, the runners ended by tungsten vias have no reservoir to replenish during electromigration depletion. Additionally, via processes may affect the underlying metal integrity. For instance, non-conformal via barriers may expose aluminum to the tungsten fluoride ($WF_6$) gas during chemical vapor deposition. Tungsten fluoride will react with aluminum to form high resistive compounds and cause IC open failure. Moreover, inappropriate post window cleans may leave contaminants near the via bottom, leading to open or functional failure.

Since the problem of electromigration is not completely addressed by present day processes, it is highly desirable to reduce electromigration wherever possible and as much as possible within the semiconductor structures that form the IC.

Accordingly, what is needed in the art is method of further reducing the amount of electromigration that occurs in a semiconductor device.

SUMMARY OF THE INVENTION

To address the above-discussed deficiencies of the prior art, the present invention provides a method of forming an electromigration resisting layer in a semiconductor device. In an exemplary embodiment, the method comprises depositing a corrosion inhibitor comprising an organic ligand containing oxygen, on a conductive layer of a semiconductor device wherein the conductive layer is susceptible to electromigration. The method further includes subjecting the corrosion inhibitor and the semiconductor device to a high temperature anneal to form an electromigration resisting layer on the conductive layer that reduces electromigration of the conductive layer.

In another advantageous embodiment, the present invention provides a method of forming an integrated circuit. In this particular aspect, the method includes: (1) forming openings in a dielectric layer located over transistors and to conductive layers, (2) depositing a corrosion inhibitor comprising an organic ligand on the conductive layers and within the openings wherein the conductive layers is susceptible to electromigration, (3) subjecting the corrosion inhibitor and the semiconductor device to a high temperature anneal to form an electromigration resisting layer on the conductive layers that reduces electromigration of the conductive layers, (4) forming conductive material in the openings to form interconnects, and (5) connecting the interconnects with the transistors to form an operative integrated circuit.

An integrated circuit is also provided by the present invention. In an illustrative embodiment, the integrated circuit includes interconnects located in dielectric layers located over transistors. The interconnects contact conductive traces and interconnect the transistors to form an operative integrated circuit. The integrated circuit also includes an electromigration resisting film located on at least one of the conductive traces and where the interconnect contacts the conductive trace. The electromigration resisting film provides a conductive trace having an average electromigration lifetime ranging from about 100 hours to about 200 hours.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGURE. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
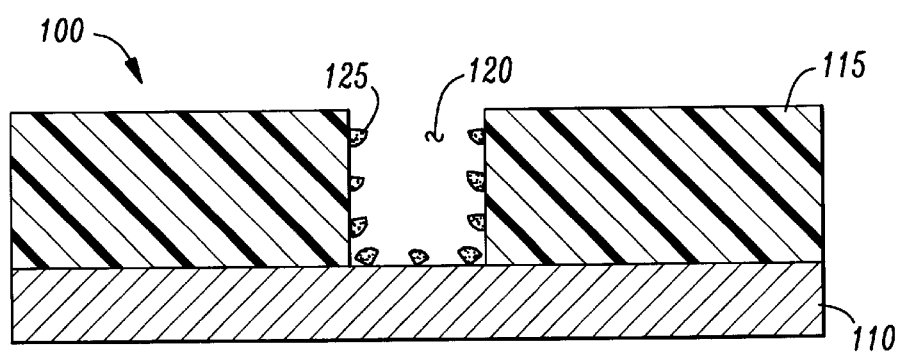
FIG. 1 illustrates a partial sectional view of a semiconductor device that may be employed in an integrated circuit.

Referring initially to FIG. 1, there is illustrated a partial sectional view of a semiconductor device 100 that may be employed in an integrated circuit. In the illustrated embodiment, the semiconductor device 100 includes a conductive layer 110 having a dielectric layer 115 deposited thereon. The conductive layer 110 may be any conductive layer typically found in a semiconductor device. For example, the conductive layer 110 may be a metal trace and more specifically may be a metal trace comprising aluminum, an aluminum alloy or a metal stack having an aluminum layer incorporated therein. Both the conductive layer 110 and the dielectric layer 115 may be deposited using conventional methods that are well known to those who are skilled in the art.

Following the deposition of the dielectric layer 115, an opening 120, which later forms a contact or via, is conventionally formed in the dielectric layer 115. The etch that is used to form the opening 120 often leaves residue materials 125 on the sidewalls and the bottom of the opening 120. To ensure a good contact plug or via formation, it is important that these residue materials 125 be cleaned. The strippers that are often used to clean the opening 120 in back-end cleaning processes are usually organic solvent blends. Moreover, they typically consist of a majority solvent base, an amine (or a nucleophille), and additives, such as corrosion inhibitors (which often include phenolic groups), complexing ligands and surfactants, which are well known to those who are skilled in the art. Commercially available examples of well known corrosion inhibitors include ACT-CMI®, which is available from the Ashland-ACT Corporation in Easton, Pa. and is an oxyquinoline-based (i.e., contains an oxyquinoline) corrosion inhibitor, PRS® and ALEG® brands, both of which are available from Mallinkrodt-Baker Corporation, Phillipsburg, N.J., and which are cathecol-based (i.e., contains a cathecol) corrosion inhibitors.

Figure 2:
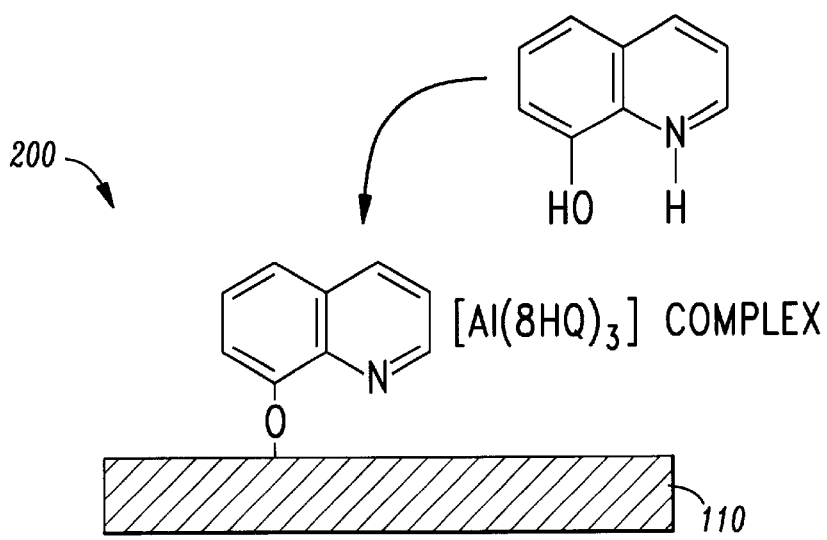
FIG. 2 illustrates the oxyquinoline or cathecol portion of the corrosion inhibitor forming a complex with the conductive layer.

It has been observed that these corrosion inhibitors do not wash off during subsequent cleaning processing steps. It is believed that either the oxyquinoline or cathecol portion of the corrosion inhibitor forms a complex 200 with the conductive layer 110, as schematically illustrated in FIG. 2. In an illustrative embodiment, the corrosion inhibitor component of the cleaning solvent includes oxyquinoline, and in a more specific embodiment, the oxyquinoline is 8-hydroxyquinoline. As discussed below, this particular class of compounds shows substantial improvement in the reduction of electromigration within the conductive layer 110 when processed under the conditions provided by the present invention. It should be noted, however, that the cathecol-based corrosion inhibitors also demonstrates substantial electromigration improvement when processed under the conditions provided by the present invention.

Figure 3:
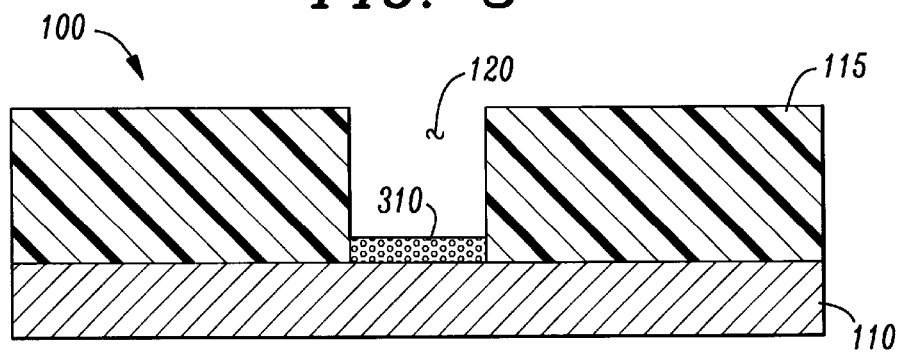
FIG. 3 illustrates a partial sectional view of an exemplary embodiment of the semiconductor device of FIG. 1 following the cleaning of the opening by the above described solvents.

Turning now to FIG. 3, there is illustrated a partial sectional view of an exemplary embodiment of the semiconductor device 100 of FIG. 1 following the cleaning of the opening 120 by the above described solvents. As shown, the corrosion inhibitor has formed the complex film 310 at the bottom of the opening 120 and on the conductive layer 110. The semiconductor device 100 is then annealed to further cure the complex. The semiconductor device 100 with the complex film 310 are then subjected to an annealing temperature at ambient atmosphere for a period of time. The temperature and time at which the semiconductor device 100 and the complex film 310 are subjected to the anneal may vary, depending on the materials comprising the conductive layer 110 and the complex film 310. In an exemplary embodiment, the temperature may range from about 100° C. to about 450° C., and more specifically a temperature ranging from about 100° C. to about 320° C. For example, if the conductive layer 110 comprises aluminum, a temperature of 450° C. should not be exceeded.

The chemical mechanism of what occurs is not fully understood. It is observed, however, that the annealing process provides an electromigration resisting film that is superior and more robust than films that are not annealed in accordance with the present invention. The electromigration resisting film typically has a thickness that ranges from about 1 nm to about 15 nm, and more specifically a thickness that ranges from about 2 nm to about 5 nm. In an advantageous embodiment, the electromigration resisting film has a thickness of about 2 nm. These contrasting results are shown in the following tables where various corrosion inhibitors were used. The corrosion inhibitors were selected from commercially available corrosion inhibitors as generally discussed above. These corrosion inhibitors are well known to those who are skilled in the art.

Experimnental

The impact of post-window cleaning chemistry and process flow on the long-term electromigration reliability of 0.25 μm technology with and without a post-cleaning anneal were examined.

Two level short-loop testers were used in these studies; wafers were split after windows were etched for cleaning with various side-wall polymer removers listed in TABLES 1 and 2. The initial cleaning was followed by some oxide-etching process (wet etches with NE12 from Ashland-ACT) or by down-stream fluoride plasma (NaR). After processing, the wafers were re-annealed in air at a temperature of about 250° C. for about 500 hours, re-tested, and packaged for electromigration (EM) testing. EM testing was conducted at 250° C., with a current density of 1 $MA/cm^2$. The results are reported in following TABLES 1 and 2.

Figure 4:
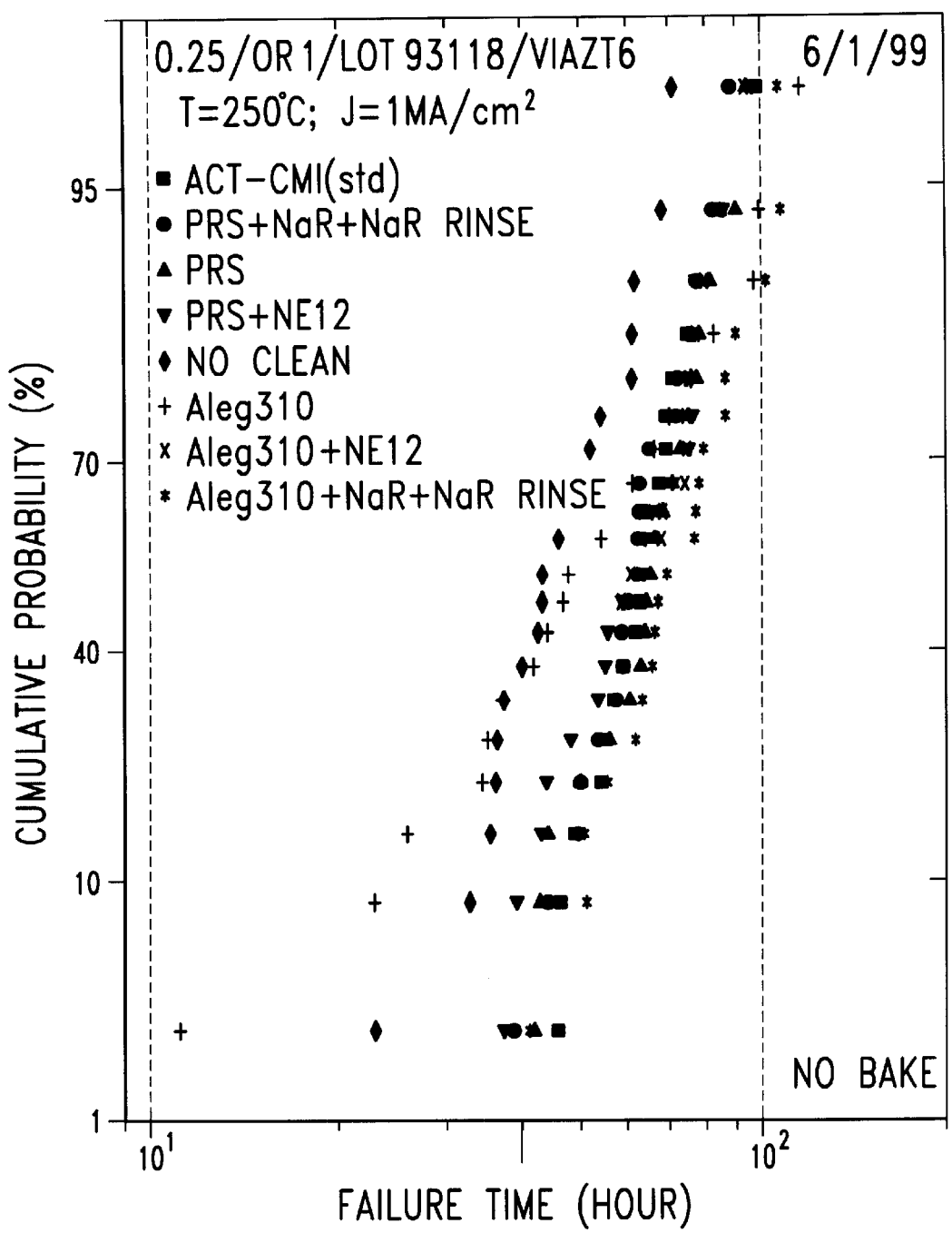
FIG. 4 illustrates the distribution of electromigration lifetimes as a function of window cleaning chemistry.

The following Table 1, which corresponds to FIG. 4, lists experimental results obtained when no anneal is conducted:

TABLE 1

| No Anneal | J ($MA/cm^2$) | Sigma | t50 (test) hr |
|---|---|---|---|
| ACT-CMI + NaR (std) | 1 | 0.204 | 65.19 |
| PRS + NaR | 1 | 0.225 | 63.09 |
| PRS | 1 | 0.241 | 66.76 |
| PRS + NE12 | 1 | 0.294 | 62.51 |
| No clean | 1 | 0.291 | 46.39 |
| Aleg310 | 1 | 0.587 | 50.72 |
| Aleg310 + NE12 | 1 | 0.536 | 59.38 |
| Aleg310 + NaR | 1 | 0.269 | 73.15 |

As seen from Table 1, even the oxyquinoline-based ACT-CMI® has only an average lifetime of 65.19 hours when the device is not subjected to an anneal process. These results are further illustrated in FIG. 4 which shows Cumulative Probability (%) as a function of Failure Time in hours. By way of example, based on FIG. 4, there will be about a 97% failure rate of the device at about 100 hours in the sample using ACT-CMI®. The failure times of the other complexed corrosion inhibitors are illustrated.

Figure 5:
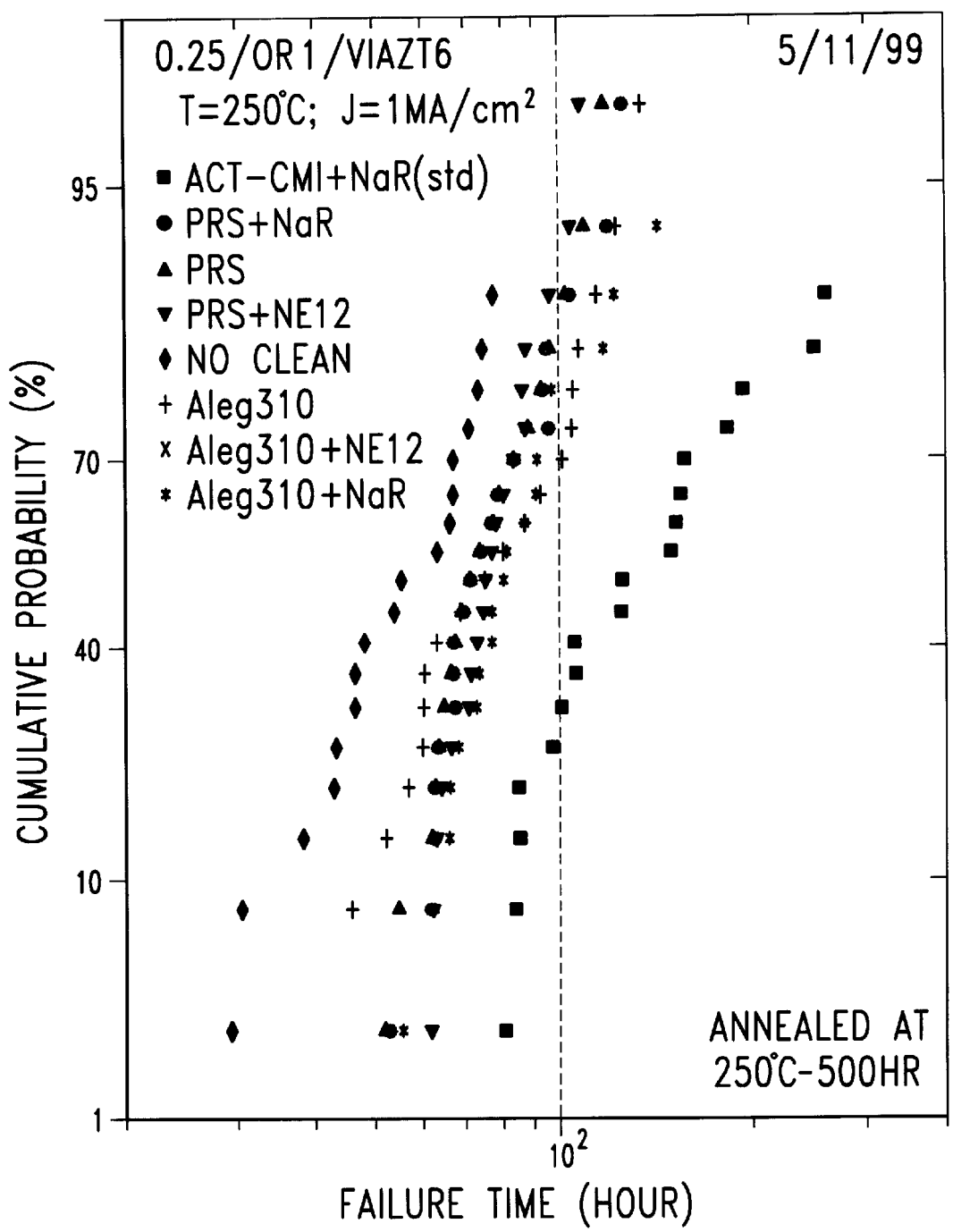
FIG. 5 illustrates the distribution of electromigration lifetimes as a function of window cleaning chemistry and subsequent anneal.

Table 2, which follows and corresponds to FIG. 5, lists the results following an anneal at 250° C. for about 500 hours.

TABLE 2

| Anneal at 250° C.-500 hr | J ($MA/cm^2$) | Sigma | t50 (test) hr |
|---|---|---|---|
| ACT-CMI + NaR (std) | 1 | 0.476 | 147.15 |
| PRS + NaR | 1 | 0.237 | 81.12 |
| PRS | 1 | 0.239 | 77.71 |
| PRS + NE12 | 1 | 0.181 | 79.62 |
| No clean | 1 | 0.41 | 59.61 |
| Aleg310 | 1 | 0.398 | 77.78 |
| Aleg310 + NE12 | 1 | 0.28 | 84.82 |
| Aleg310 + NaR | 1 | 0.294 | 87.94 |

As seen from Table 2, all of the devices using the various listed corrosion inhibitors show improved results in electromigration retardation that result in longer device lifetime. However, the oxyquinoline-based ACT-CMI® shows substantial improvement in device lifetime. The sample in which the 8-hydroxyquinoline is used exhibits an improved lifetime of greater than 200% after the anneal, as compared to before the anneal. These results are further illustrated in FIG. 5 which shows Cumulative Probability (%) as a function of Failure Time in hours. By way of example, based on FIG. 5, there will be about a 50% failure rate of the device at about 147 hours in the sample using ACT-CMI® (8-hydroxyquinoline). The failure times of the other complexed corrosion inhibitors are illustrated and show increased average lifetimes as a result of reduced electromigration.

FIG. 5 compares the distribution of electromigration lifetimes as a function of window cleaning chemistry and subsequent anneal. Inspection of FIG. 5 reveals the following: (a) while uncleaned windows afforded the shortest lifetimes, ACT-CMI® (oxyquinoline-based) cleaned windows had the longest lifetimes, (b) ACT-CMI® cleaned windows produced a wide range of lifetimes, (c) the lifetimes of annealed samples cleaned with PRS3000® and ALEG-310® are comparable to samples cleaned with ACT-CMI®. The data also shows that the EM enhancement is thermally activated. The unique enhanced electromigration lifetimes of windows cleaned with ACT-CMI® suggest that the material depletion around a tungsten plug is inhibited by the altered interfacial energy between the tungsten plug and the Al-runner, probably due to the formation of tris-(8-hydroxyquinoline)-aluminum (III), $(Al(8-HQ)_3)^{3+}$ at the boundaries. It is believed that the complexation of the exposed Al at the bottom of the window by the corrosion inhibitor reduces the flux divergence at the tungsten plug/Al-runner interface by clogging grain boundaries, which improves the EM problems.

Figure 6:
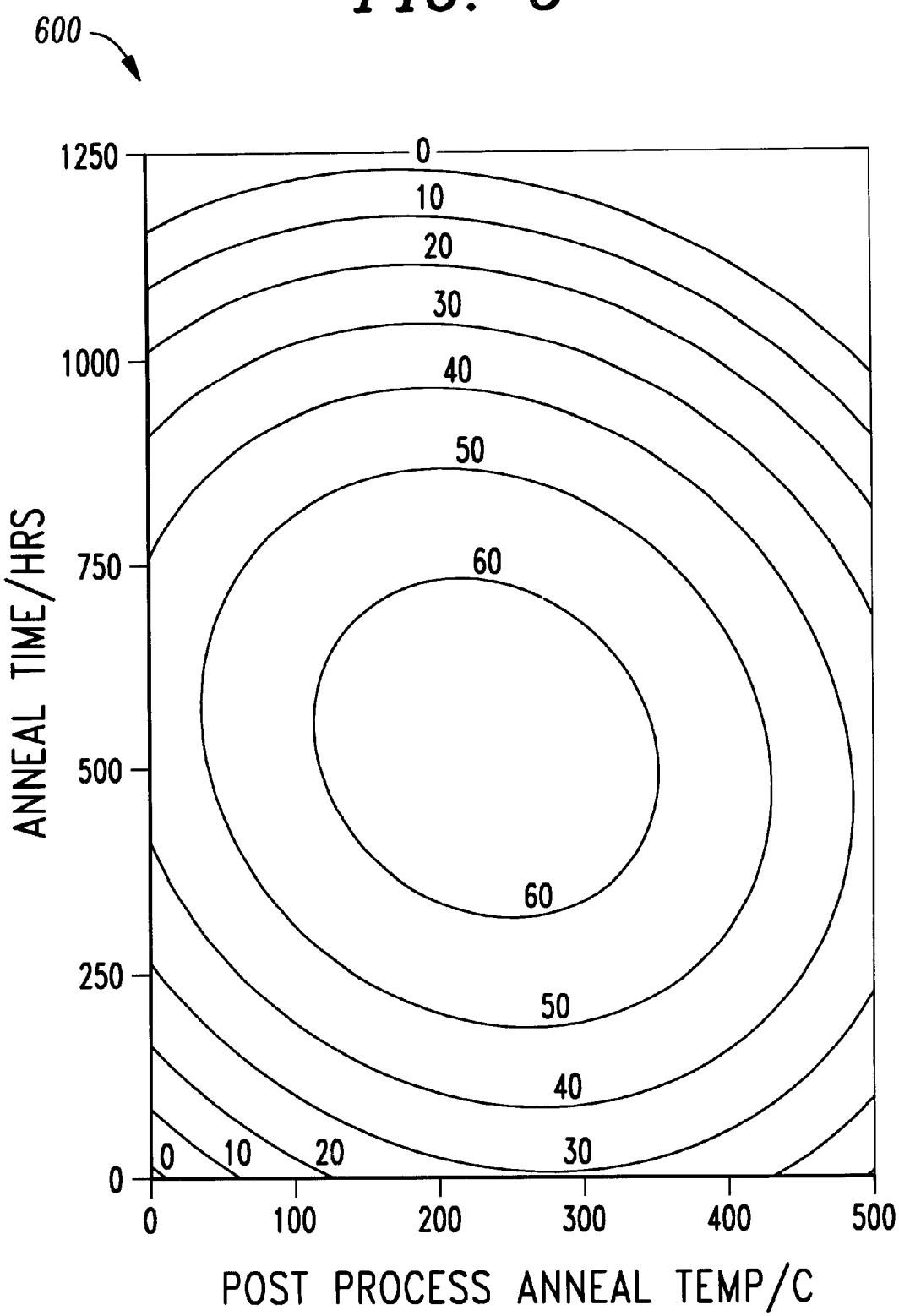
FIG. 6 illustrates a more comprehensive spectrum of annealing times and temperatures in the sample using ACT-CMI®.

A more comprehensive spectrum of annealing times and temperatures in the sample using ACT-CMI® are illustrated in FIG. 6, which relates back to FIG. 5. As noted, the y-axis is Anneal Time/hrs, the x-axis is Post Process Anneal Temperature/° C., and the various contour lines represent percentage of device failure at the various times illustrated in FIG. 5. As seen from FIG. 6, substantial electromigration improvement occurs at anneal temperatures ranging from about 190° C. to about 350° C., and more specifically an anneal temperature ranging from about 300° C. to about 320° C., and anneal times ranging from about 125 hours to about 650 hours.

Figure 7:
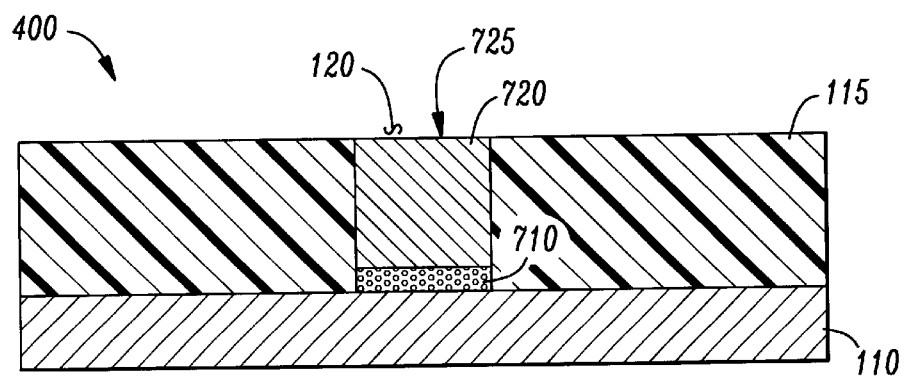
FIG. 7 illustrates partial sectional view of FIG. 3, after the opening is filled with a conductive plug or via material to form either a contact plug or a via.

Turning now briefly to FIG. 7, there is illustrated a partial sectional view of FIG. 3, after annealing. The partial sectional view includes a electromigration resisting layer 710, which results from the annealing of the complex film 310. Also, located within the opening 120 is a conductive plug or via material 720, forming either a contact plug or a via 725. It should be noted that the electro migration resisting layer 710 forms an interface between the conductive layer 110 and the conductive plug or via material 720.

Figure 8:
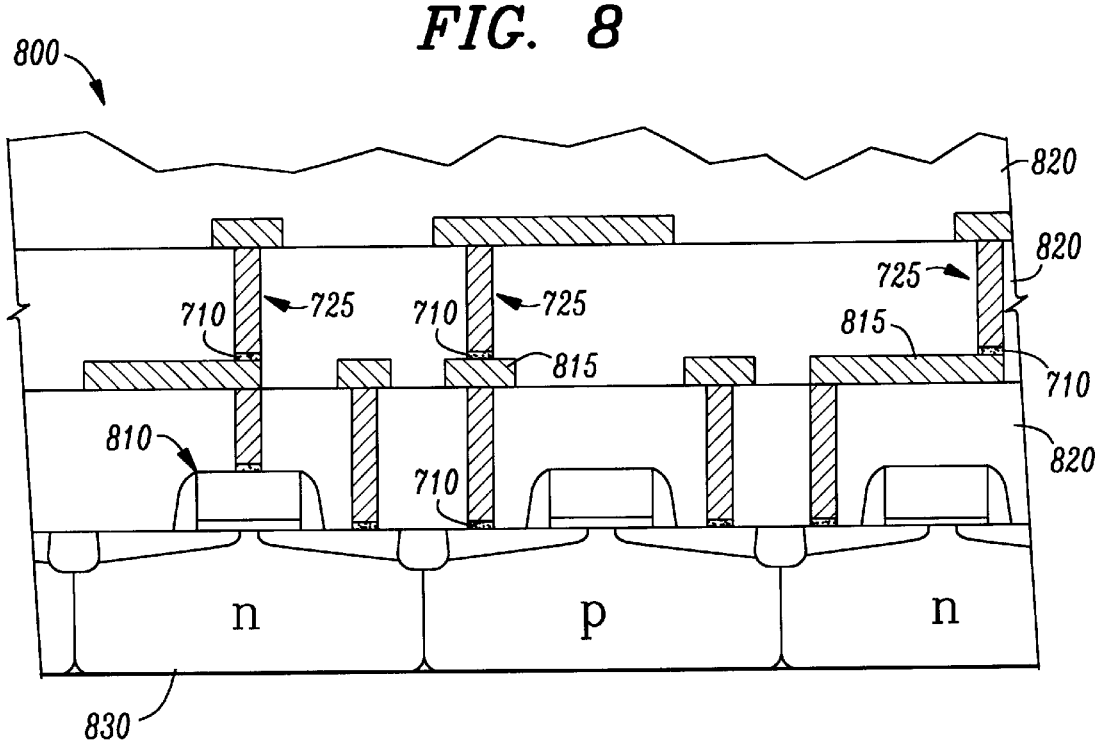
FIG. 8 illustrates a sectional view of an exemplary embodiment of a conventional integrated circuit that can employ the improved interconnect structure discussed above.

Turning now to FIG. 8 there is illustrated a sectional view of an exemplary embodiment of a conventional integrated circuit 800 that can employ the improved interconnect structure discussed above. As shown, the integrated circuit 800 includes conventional transistors 810, such as a complementary metal oxide semiconductor (CMOS) transistor device, that is connected to interconnects 815 by contact plugs or vias 725 and the electromigration resisting layer 710. Dielectric layers 820 isolate the various layers of the IC 800. As illustrated, the transistors 810 are located on a semiconductor wafer substrate 830, and the interconnects 815 and contact plugs or vias 725, which are located within the dielectric layer 820, connect the transistors 810 to different layers within the IC circuit 800. One having skill in the art knows how to fabricate the transistors 810 and the dielectric layers 820, and the method of fabricating the unique contact plug or vias 725 and electromigration resisting layer 710 have been described in detail above. Furthermore, it is also understood that multiple interconnects 815, contact plugs or vias 725, transistors 810 and dielectric layers 820, may typically be combined to form the IC 800.

Although the present invention has been described in detail, those skilled in the art should understand that they can make various changes, substitutions and alterations herein without departing from the spirit and scope of the invention in its broadest form.

What is claimed is:

1. A method of forming a semiconductor device, comprising:
   depositing a corrosion inhibitor comprising an organic ligand on a conductive layer of a semiconductor device, the conductive layer being susceptible to electromigration; and
   subjecting the corrosion inhibitor and the semiconductor device to a high temperature anneal to form an electromigration resisting layer on the conductive layer that reduces electromigration of the conductive layer.

2. The method as recited in claim 1 wherein depositing a corrosion inhibitor includes depositing a corrosion inhibitor that comprises oxyquinoline.

3. The method as recited in claim 2 wherein depositing a corrosion inhibitor that comprises oxyquinoline includes depositing a corrosion inhibitor that comprises 8-hydroxyquinoline.

4. The method as recited in claim 1 wherein subjecting the corrosion inhibitor and the semiconductor device to a high temperature anneal includes subjecting the corrosion inhibitor and the semiconductor device to temperature ranging from about 100° C. to about 450° C.

5. The method as recited in claim 4 wherein subjecting the corrosion inhibitor and the semiconductor device to a high temperature anneal includes subjecting the corrosion inhibitor and the semiconductor device to temperature ranging from about 100° C. to about 320° C.

6. The method as recited in claim 4 wherein subjecting the corrosion inhibitor and the semiconductor device to a high temperature anneal includes subjecting the corrosion inhibitor and the semiconductor device to a high temperature anneal for a period of time ranging from about 125 hours to about 500 hours.

7. The method as recited in claim 1 wherein subjecting includes subjecting the corrosion inhibitor and the semiconductor device to a high temperature anneal to form an electromigration resisting layer wherein the conductive layer has an average electromigration lifetime ranging from about 100 hours to about 200 hours at about 1 MA/cm$^2$ and about 250° C.

8. The method as recited in claim 1 wherein depositing includes depositing a corrosion inhibitor on a metal trace layer.

9. The method as recited in claim 8 wherein depositing a corrosion inhibitor on a metal trace layer includes depositing a corrosion inhibitor on an aluminum trace.

10. The method as recited in claim 1 wherein the conductive layer is an aluminum (Al) trace and the corrosion inhibitor comprises 8-hydroxyquinoline (8HQ) and subjecting includes complexing the 8-hydroxyquinoline with aluminum to form [Al(8HQ)$_3$].

11. The method as recited in claim 1 wherein subjecting the corrosion inhibitor to form an electromigration resisting layer includes subjecting the corrosion inhibitor to form an electromigration resisting layer having a thickness that ranges from about 1 nm to about 15 nm.

12. The method as recited in claim 11 wherein subjecting the corrosion inhibitor to form an electromigration resisting layer having a thickness that ranges from about 1 nm to about 15 nm includes subjecting the corrosion inhibitor to form an electromigration resisting layer having a thickness that ranges from about 2 nm to about 5 nm.

13. The method as recited in claim 12 wherein subjecting the corrosion inhibitor to form an electromigration resisting layer having a thickness that ranges from about 2 nm to about 5 nm includes subjecting the corrosion inhibitor to form an electromigration resisting layer having a thickness of about 2 nm.

14. A method of forming an integrated circuit, comprising;
   forming openings in a dielectric layer located over transistors and to conductive layers;
   depositing a corrosion inhibitor comprising an organic ligand on the conductive layers and within the openings, the conductive layers being susceptible to electromigration;
   subjecting the corrosion inhibitor and the semiconductor device to a high temperature anneal to form an electromigration resisting layer on the conductive layers that reduces electromigration of the conductive layers;
   forming a conductive material in the openings to form interconnects; and
   connecting the interconnects with the transistors to form an operative integrated circuit.

15. The method as recited in claim 14 wherein depositing a corrosion inhibitor includes depositing a corrosion inhibitor that comprises oxyquinoline.

16. The method as recited in claim 14 wherein depositing a corrosion inhibitor that comprises oxyquinoline includes depositing a corrosion inhibitor that comprises 8-hydroxyquinoline.

17. The method as recited in claim 14 wherein subjecting the corrosion inhibitor and the semiconductor device to a high temperature anneal includes subjecting the corrosion inhibitor and the semiconductor device to temperature ranging from about 100° C. to about 320° C.

18. The method as recited in claim 17 wherein subjecting the corrosion inhibitor and the semiconductor device to a high temperature anneal includes subjecting the corrosion inhibitor and the semiconductor device to a high temperature anneal for a period of time ranging from about 125 hours to about 500 hours.

19. The method as recited in claim 14 wherein subjecting includes subjecting the corrosion inhibitor and the semiconductor device to a high temperature anneal to form an electromigration resisting layer wherein the conductive layer has an average electromigration lifetime ranging from about 100 hours to about 200 hours at about 1 MA/cm$^2$ and 250° C.

20. The method as recited in claim 14 wherein depositing a corrosion inhibitor on conductive layers includes depositing a corrosion inhibitor on aluminum traces.

21. The method as recited in claim 20 wherein the conductive layer is an aluminum (Al) trace and the corrosion inhibitor comprises 8-hydroxyquinoline (8HQ) and subjecting includes complexing the 8-hydroxyquinoline with aluminum to form [Al (8HQ)$_3$].

22. The method as recited in claim 14 wherein subjecting the corrosion inhibitor to form an electromigration resisting layer includes subjecting the corrosion inhibitor to form an electromigration resisting layer having a thickness that ranges from about 1 nm to about 15 nm.

23. The method as recited in claim 22 wherein subjecting the corrosion inhibitor to form an electromigration resisting layer having a thickness that ranges from about 1 nm to about 15 nm includes subjecting the corrosion inhibitor to form an electromigration resisting layer having a thickness that ranges from about 2 nm to about 5 nm.

24. The method as recited in claim 23 wherein subjecting the corrosion inhibitor to form an electromigration resisting layer having a thickness that ranges from about 2 nm to about 5 nm includes subjecting the corrosion inhibitor to form an electromigration resisting layer having a thickness of about 2 nm.

* * * * *